(12) United States Patent
Yun

(10) Patent No.: US 9,117,517 B2
(45) Date of Patent: Aug. 25, 2015

(54) NON-VOLATILE SEMICONDUCTOR DEVICE AND METHOD FOR CONTROLLING THE SAME

(75) Inventor: Sun Hyuck Yun, Icheon (KR)

(73) Assignee: SK HYNIX INC., Icheon (KR)

( * ) Notice: Subject to any disclaimer, the term of this patent is extended or adjusted under 35 U.S.C. 154(b) by 37 days.

(21) Appl. No.: 13/607,620

(22) Filed: Sep. 7, 2012

(65) Prior Publication Data

US 2013/0294182 A1 Nov. 7, 2013

(30) Foreign Application Priority Data

May 4, 2012 (KR) .......................... 10-2012-0047420

(51) Int. Cl.
*G11C 7/10* (2006.01)
*G11C 13/00* (2006.01)
*G11C 16/08* (2006.01)
*G11C 16/32* (2006.01)

(52) U.S. Cl.
CPC ........ *G11C 13/0061* (2013.01); *G11C 13/0004* (2013.01); *G11C 13/0023* (2013.01); *G11C 16/08* (2013.01); *G11C 16/32* (2013.01)

(58) Field of Classification Search
USPC ............................. 365/189.15, 189.16, 189.17
See application file for complete search history.

(56) References Cited

U.S. PATENT DOCUMENTS

| | | | | |
|---|---|---|---|---|
| 5,777,938 A | * | 7/1998 | Nakamura et al. | 365/220 |
| 2005/0082579 A1 | * | 4/2005 | Horii et al. | 257/222 |
| 2007/0156996 A1 | * | 7/2007 | Chung | 711/167 |
| 2009/0259895 A1 | * | 10/2009 | Jung | 714/718 |
| 2009/0268528 A1 | * | 10/2009 | Kim et al. | 365/189.5 |
| 2012/0137046 A1 | * | 5/2012 | Tak et al. | 711/102 |
| 2013/0111101 A1 | * | 5/2013 | Yoon | 711/5 |

OTHER PUBLICATIONS

JESD79F, "Double Data Rate (DDR) SDRAM," JEDEC Feb. 2008. 84 pages.*

* cited by examiner

*Primary Examiner* — Shawki S Ismail
*Assistant Examiner* — Muhammad Islam

(57) ABSTRACT

A non-volatile semiconductor device and a method for controlling the same are disclosed, which can increase a read efficiency of the non-volatile semiconductor device using the Low Power Double Data Rate (LPDDR) 2 specifications. The non-volatile semiconductor device includes a decoder configured to output a plurality of active control signals by decoding an active address and an active signal, and a plurality of active controls configured to be controlled by the plurality of active control signals and a plurality of active reset signals so as to generate a plurality of active enable signals that are independently activated.

9 Claims, 8 Drawing Sheets

NON-VOLATILE SEMICONDUCTOR DEVICE AND METHOD FOR CONTROLLING THE SAME

CROSS-REFERENCE TO RELATED APPLICATION

The priority of Korean patent application No. 10-2012-0047420 filed on May 4, 2012, the disclosure of which is hereby incorporated in its entirety by reference, is claimed.

BACKGROUND OF THE INVENTION

Embodiments of the present invention relate to a technology for increasing the read efficiency of a non-volatile semiconductor device using Low Power Double Data Rate (LP-DDR) 2 specifications.

Memory devices can be classified as a volatile memory device or a non-volatile memory device. A non-volatile memory device includes a non-volatile memory cell capable of preserving stored data even when it is not powered. A non-volatile memory device may be implemented as a flash random access memory (flash RAM), a phase change random access memory (PCRAM), or the like.

A PCRAM includes a memory cell that is implemented using a phase change material such as germanium antimony tellurium (GST). The GST changes to a crystalline phase or an amorphous phase if heat is applied to the GST, thereby storing data in the memory cell.

A non-volatile memory device (e.g., a magnetic memory, a phase change memory (PCM), or the like) has a data processing speed similar to that of a volatile RAM device. The non-volatile memory device also preserves data even when power is turned off.

FIGS. 1A and 1B illustrate a conventional phase change resistor (PCR) element 4.

Referring to FIGS. 1A and 1B, the PCR element 4 includes a top electrode 1, a bottom electrode 3, and a phase change material (PCM) layer 2 located between the top electrode 1 and the bottom electrode 3. If a voltage and a current are applied to the top electrode 1 and the bottom electrode 3, a current signal is provided to the PCM layer 2, and a high temperature is induced in the PCM layer 2. As a result, the electrical conductive status of the PCM layer 2 changes depending on resistance variation.

FIGS. 2A and 2B illustrate a phase change principle of the conventional PCR element 4.

Referring to FIG. 2A, if a low current, smaller than a threshold value, flows in the PCR element 4, the PCM layer 2 has a temperature suitable for a crystalline phase. Therefore, the PCM layer 2 changes to the crystalline phase, such that it becomes a low-resistance phase material. As a result, a current may flow between the top electrode 1 and the bottom electrode 3.

On the other hand, as shown in FIG. 2B, if a high current, greater than the threshold value, flows in the PCR element 4, the PCM layer 2 has a temperature higher than a melting point. Therefore, the PCM layer 2 changes to an amorphous phase, such that it becomes a high-resistance phase material. As a result, it is difficult for a current to flow between the top electrode 1 and the bottom electrode 3.

As described above, the PCR element 4 can store data corresponding to two resistance phases. For example, if the PCR element 4 has a low-resistance phase set to data '1' and the PCR element 4 has a high-resistance phase set to data '0', the PCR element 4 may store two logic states of data.

In addition, since a phase of the PCM layer 2 (i.e., a phase change resistive material) does not change even when the phase change memory device is powered off, the aforementioned data can be stored as non-volatile data.

FIG. 3 illustrates a write operation of a conventional PCR cell.

Referring to FIG. 3, when a current flows between the top electrode 1 and the bottom electrode 3 of the PCR element 4 for a predetermined time, heat is generated.

Assuming that a low current, smaller than a threshold value, flows in the PCR element 4 during the predetermined time, the PCM layer 2 has the crystalline phase formed by a low-temperature heating state, such that the PCR element 4 becomes a low-resistance element having a set state.

However, if a high current, greater than the threshold value, flows in the PCR element 4 during the predetermined time, the PCM layer 2 has the amorphous phase formed by a high-temperature heating state, such that the PCR element 4 becomes a high-resistance element having a reset state.

By means of the aforementioned properties, in order to write data of the set state during the write operation, a low voltage is applied to the PCR element 4 for a long period of time. On the other hand, in order to write data of the reset state during the write operation, a high voltage is applied to the PCR element 4 for a short period of time.

The PCR memory device outputs a sensing current to the PCR element 4 during a sensing operation, such that it can sense data written in the PCR element 4.

FIG. 4 is a timing diagram illustrating operations of a conventional non-volatile semiconductor device.

Referring to FIG. 4, the conventional non-volatile semiconductor device receives a first active signal ACT as a command signal CMD, such that an active address ACTADD<0:3> is input to a decoder.

Thereafter, for instance, if an active enable signal ACTPTEN<0> is activated to a high level, an active operation of a bank PA0 starts, and a first sense amplifier (also called a first sense-amp) for the bank PA0 is activated. As a result, data read out of the bank PA0 is sensed and amplified by the first sense-amp.

After that, data sensed by the first sense-amp is transferred to a corresponding transmission line RGIO. If the active enable signal ACTPTEN<0> is transitioned to a low level, the active operation is completed.

In this case, a specific period from an input point of the first active signal ACT to an input point of a read command READ may correspond to a Row Active to Column Active Delay time (tRCD).

Subsequently, if the read command READ is input as the command signal CMD, a read operation for the bank PA0 is performed. The data loaded into the transmission line RGIO is output to an external device through a data output pad.

In this case, a specific period from an input point of the first active signal ACT to an input point of the next active signal ACT may correspond to a Row Active to Row Active Delay time (tRRD). According to LPDDR2 non-volatile memory (NVM) specifications, tRCD may be defined as a maximum of about 250 ns, and tRRD may be identical to tRCD.

Subsequently, if a second active signal ACT is input as the command signal CMD, another active address ACTADD<0:3> is input.

Thereafter, for example, if an active enable signal ACTPTEN<1> is activated to a high level, an active operation of a bank PA1 starts, and a second sense-amplifier for the bank PA1 is activated. As a result, data read out of the bank PA1 is sensed and amplified by the second sense-amplifier.

After that, data sensed by the second sense-amplifier is transferred to the transmission line RGIO. Thereafter, if the active enable signal ACTPTEN<1> is transitioned to a low level, the active operation is completed.

Subsequently, if a read command READ is input as the command signal CMD, a read operation for the bank PA1 is performed.

As can be seen from the operational timing diagram of FIG. 4, according to the conventional non-volatile semiconductor device, a data read operation is performed upon completion of an active operation. In addition, after completion of one active operation, the conventional non-volatile semiconductor device can enter another active operation.

However, if another bank enters an active operation while one bank is performing an active operation, an unexpected collision occurs in an internal logic due to mismatch between signals. Accordingly, a dual-active operation cannot be performed since it results in the occurrence of failed data.

In other words, if one active operation starts, it is impossible for another active operation to be performed before the first active operation is completed. Accordingly, the efficiency of data output deteriorates, and tRRD becomes longer.

Provided that the active operation and the read operation are repeatedly performed to output data, the conventional non-volatile semiconductor device must operate in the order of active operation→read operation→active operation→read operation. In this case, an overall sensing time of data is denoted by "2×tRCD+2×Read Data Output Time".

BRIEF SUMMARY OF THE INVENTION

Various embodiments of the present invention are directed to providing a non-volatile semiconductor device and a method for controlling the same, which substantially obviate one or more problems due to limitations and disadvantages of the related art.

The embodiments of the present invention relate to a non-volatile semiconductor device in which a second partition is activated while sensed data for a first partition is transferred to a transmission line (RGIO), such that a Row Active to Row Active Delay time (tRRD) is reduced and the efficiency of data output can be increased during a data read operation.

That is, while data sensed by a sense-amplifier for one bank is transferred to a transmission line (RGIO), another sensing operation can be performed on another bank in response to a next active command, resulting in increased efficiency of data output.

In accordance with one embodiment of the present invention, a non-volatile semiconductor device includes a decoder configured to output a plurality of active control signals by decoding an active address and an active signal; and a plurality of active controls configured to be controlled by the plurality of active control signals and a plurality of active reset signals so as to generate a plurality of active enable signals being independently activated.

In accordance with another embodiment of the present invention, a non-volatile semiconductor device includes a decoder configured to output a plurality of active control signals by decoding an active address and an active signal; a plurality of active controls configured to be controlled by the plurality of active control signals and a plurality of active reset signals so as to generate a plurality of active enable signals being independently activated; a plurality of banks, active states of which are selectively controlled by the plurality of active enable signals; a plurality of sense-amplifiers for sensing/amplifying data received from the bank, and transmitting the amplified data to a transmission line; and a row data buffer for buffering data received through the transmission line.

In accordance with another embodiment of the present invention, A method for controlling a non-volatile semiconductor device includes outputting a first active control signal and a second active control signal by decoding an active address and an active signal; activating a first bank by activating a first active enable signal in response to the first active control signal; and activating the second active enable signal in response to the second active control signal on the condition that the first bank is activated, thereby activating a second bank.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1A:
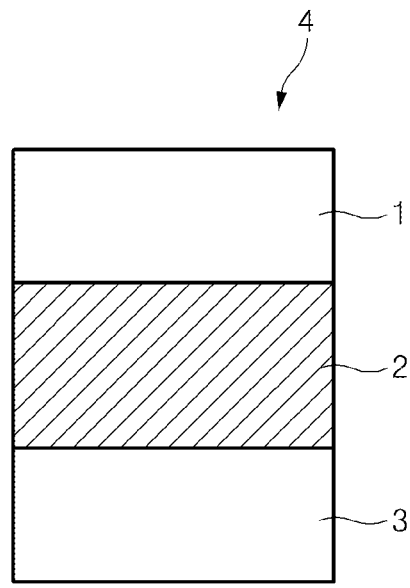
FIGS. 1A and 1B illustrate a phase change resistor (PCR) element.
Figure 1B:
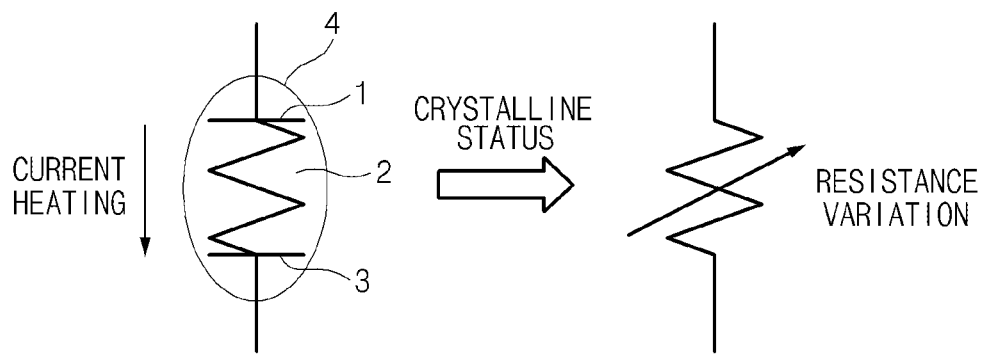
Figure 2A:
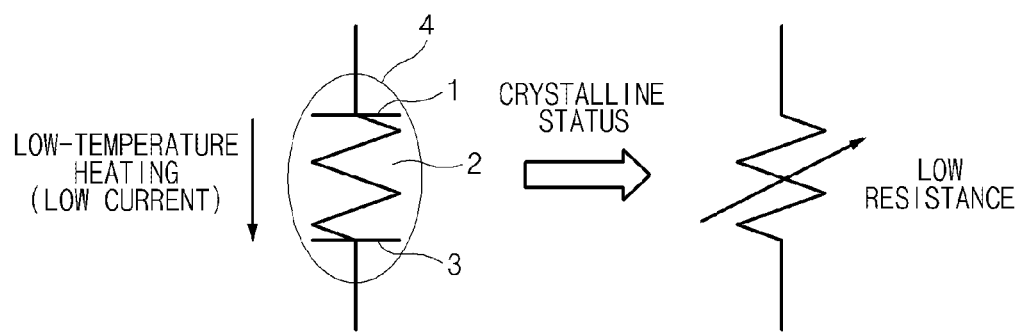
FIGS. 2A and 2B illustrate a phase change principle of a PCR element.
Figure 2B:
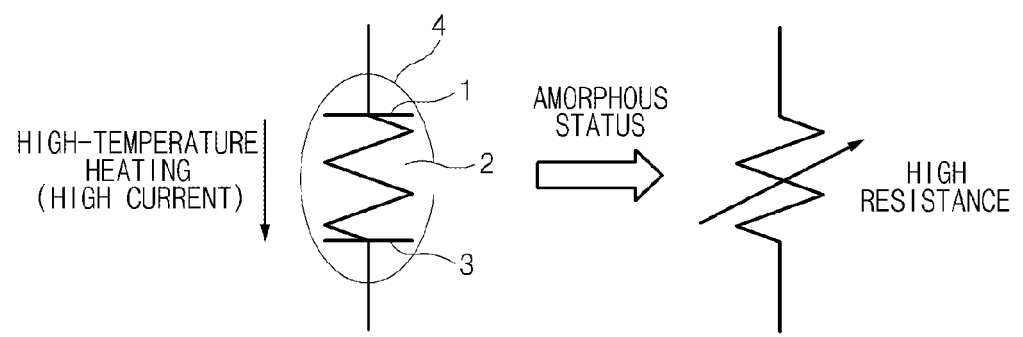
Figure 3:
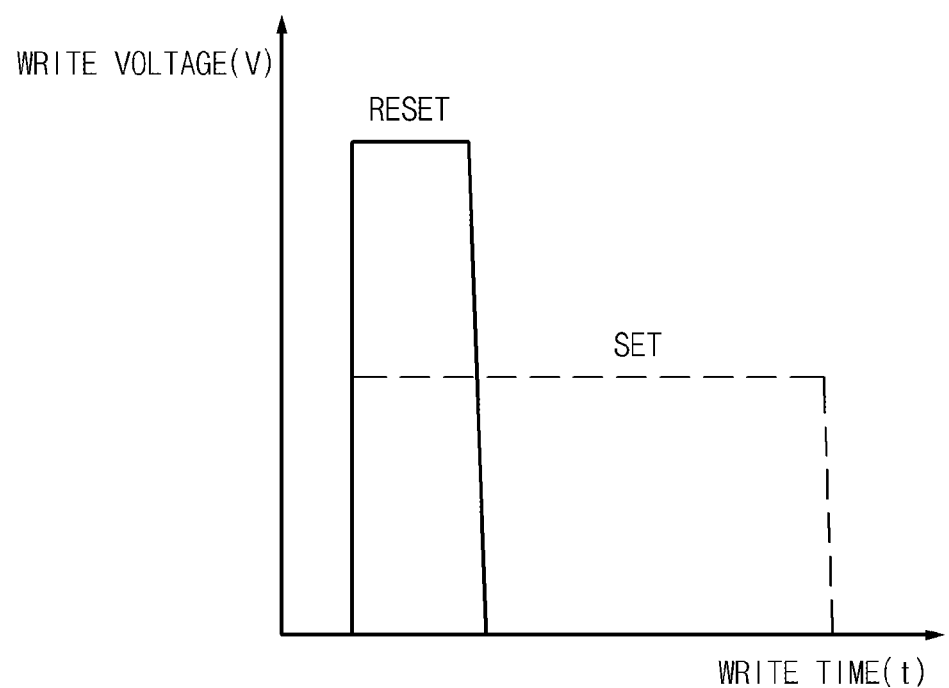
FIG. 3 illustrates a write operation of a PCR cell.
Figure 4:
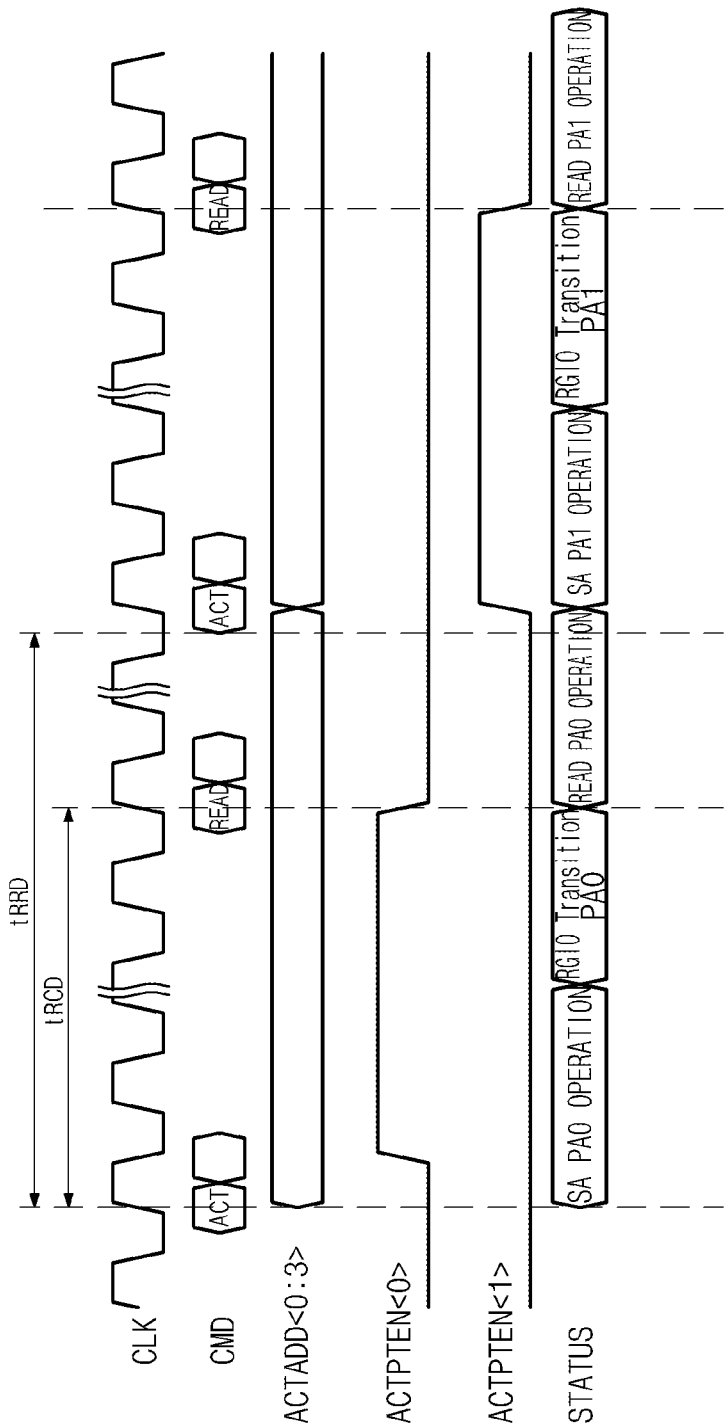
FIG. 4 is a timing diagram illustrating operations of a conventional non-volatile semiconductor device.
Figure 5:
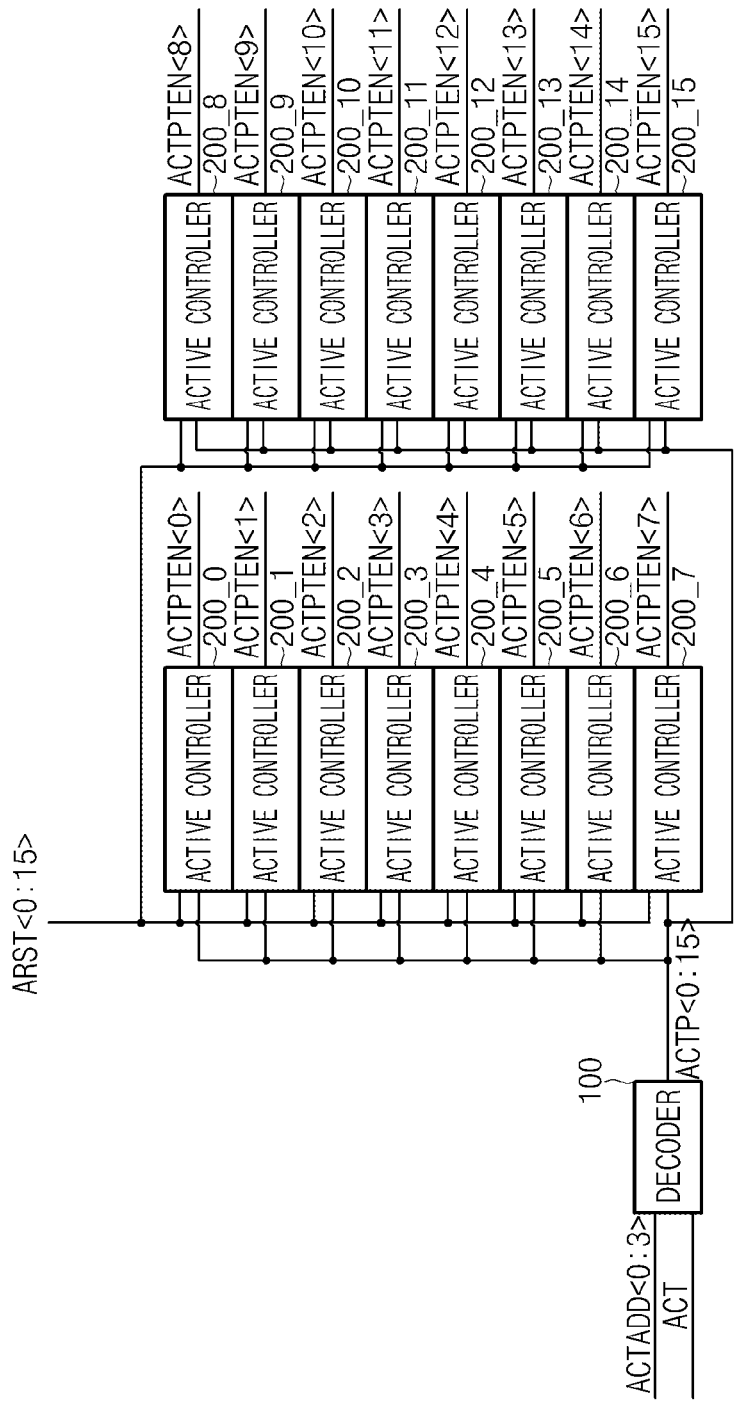
FIGS. 5 and 6 are detailed circuit diagrams illustrating a non-volatile semiconductor device according to an embodiment of the present invention.
Figure 6:
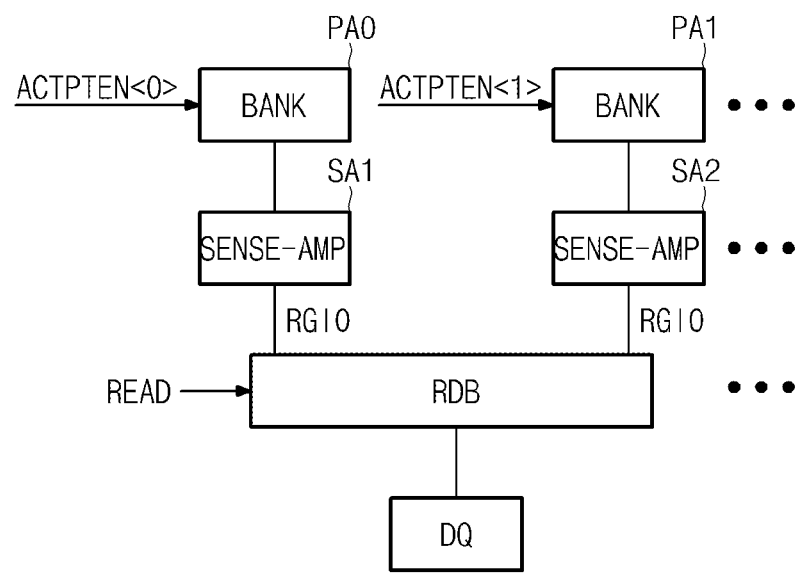

FIGS. 5 and 6 are detailed circuit diagrams illustrating a non-volatile semiconductor device according to an embodiment of the present invention.

Referring to FIGS. 5 and 6, the non-volatile semiconductor device includes a decoder 100, a plurality of active controllers 200_0~200_15, a plurality of partitions of a cell array, e.g., banks PA0 and PA1, a plurality of sense-amplifiers SA1 and SA2, a row-data buffer RDB, and a data output pad DQ. Although FIG. 6 shows only two partitions, i.e., PA0 and PA1, the number of active controllers 200_0~200_15 that may correspond to the number of the partitions.

The decoder 100 decodes an active address ACTADD<0:3> and an active signal ACT so as to output active control signals ACTP<0:15>. In an embodiment of the present invention, the active control signals ACTP<0:15> are classified according to individual partitions so as to provide classified active control signals.

The active controllers 200_0~200_15 receive the active control signals ACTP<0:15> and active reset signals ARST<0:15> and output active enable signals ACTPTEN<0:15> to banks, e.g., PA0 and PA1 in FIG. 6, thereby controlling active states of the banks.

In order to reset an active operation, the active reset signals ARST<0:15> are selectively activated. Accordingly, each of the active enable signals ACTPTEN<0:15> is independently disabled in response to the active reset signals ARST<0:15>.

According to the related art, active controllers are configured to use a common active signal line on which an active signal ACT is input, such that it is impossible for each bank PA0 or PA1 to independently perform an active operation. However, according to an embodiment of the present invention, the active signal ACT is decoded with the active address ACTADD<0:3> so as to generate the active control signals ACTP<0:15>, and the active controller 200_0~200_15 generate the active enable signals ACTPTEN<0:15> based on the active control signals ACTP<0:15> and the active reset signals ARST<0:15>, such that the active operation of each bank, e.g., PA0 or PA1 in FIG. 6, can be independently performed.

In addition, according to the related art, it is impossible for the active controllers to independently reset each of the banks that commonly use an active reset signal line through which the active reset signals ARST<0:15> are input. In contrast, according to an embodiment of the present invention, the active reset signals ARST<0:15> are input to the respective active controllers 200_0~200_15, such that a reset operation of each bank PA0 or PA1 can be performed independently.

Although the embodiment of the present invention exemplarily shows 16 active controllers 200_0~200_15 in FIG. 5 for convenience of description and better understanding of the present invention, the scope or spirit of the present invention is not limited thereto, and the number of active controllers may be set to 16 or higher, or 16 or less.

Active states of the banks, e.g., PA0 and PA1, are controlled in response to the active enable signal ACTPTEN<0:15>.

Referring to FIG. 6, if a word line is enabled by the active enable signals ACTPTEN<0:15>, cell data of the bank PA0 is output to the sense-amplifier SA1, and cell data of the bank PA1 is output to the sense-amplifier SA2.

The sense-amplifiers SA1 and SA2 are configured to sense/amplify data stored in the banks PA0 and PA1, respectively, such that the resultant data, i.e., sensed data, is output to a transmission line RGIO.

In addition, the sensed data transferred to the transmission line RGIO is output to the row data buffer RDB.

The row data buffer RDB buffers the sensed data received through the transmission line RGIO and outputs data to the I/O pad DQ in response to a read command READ.

The non-volatile memory requires a longer programming operation time as compared to a read operation time for outputting stored data. Therefore, a row buffer is used to compensate for a difference between the programming operation time and the read operation time as well as to perform its specific operation. The row buffer is considered to be the term corresponding to the sum of a row address buffer RAB and a row data buffer RDB.

In the non-volatile memory device using the Low Power Double Data Rate 2 (LPDDR2) specifications, the active operation is classified into a sensing operation period of the sense-amplifiers SA1 and SA2 and another operation period in which data sensed by the sense-amplifiers SA1 and SA2 is transferred to the transmission line RGIO.

In more detail, the active operation is classified into a first operation in which data of a memory cell is amplified by the sense-amplifiers SA1 and SA2 and a second operation in which the data amplified by the sense-amplifiers SA1 and SA2 is transferred to the row data buffer RDB through the transmission line RGIO.

The first and second operations are sequentially carried out, such that data can be transferred to the transmission line RGIO only when the first operation, i.e., the sensing/amplification operation of the sense-amplifiers SA1 and SA2, is completed.

If the above-mentioned result is denoted by a temporal specification, the sum of a sensing/amplification time of the sense-amplifier and a data transmission time of the transmission line RGIO may be denoted by a Row Active to Column Active Delay time tRCD, a Row Active to Row Active Delay time tRRD, or the like.

In more detail, during a predetermined period in which the sensing/amplification operation of the sense-amplifier (for example, SA1) of one bank (for example, PA0) is completed and the sensed data is transferred to the transmission line RGIO, an active operation of another bank (for example, PA1) can be performed so that the sense-amplifier (for example, SA2) of the bank PA1 can be activated. In this case, tRRD is determined to be shorter than tRCD, such that the data output efficiency caused by the read operation can be improved.

Figure 7:
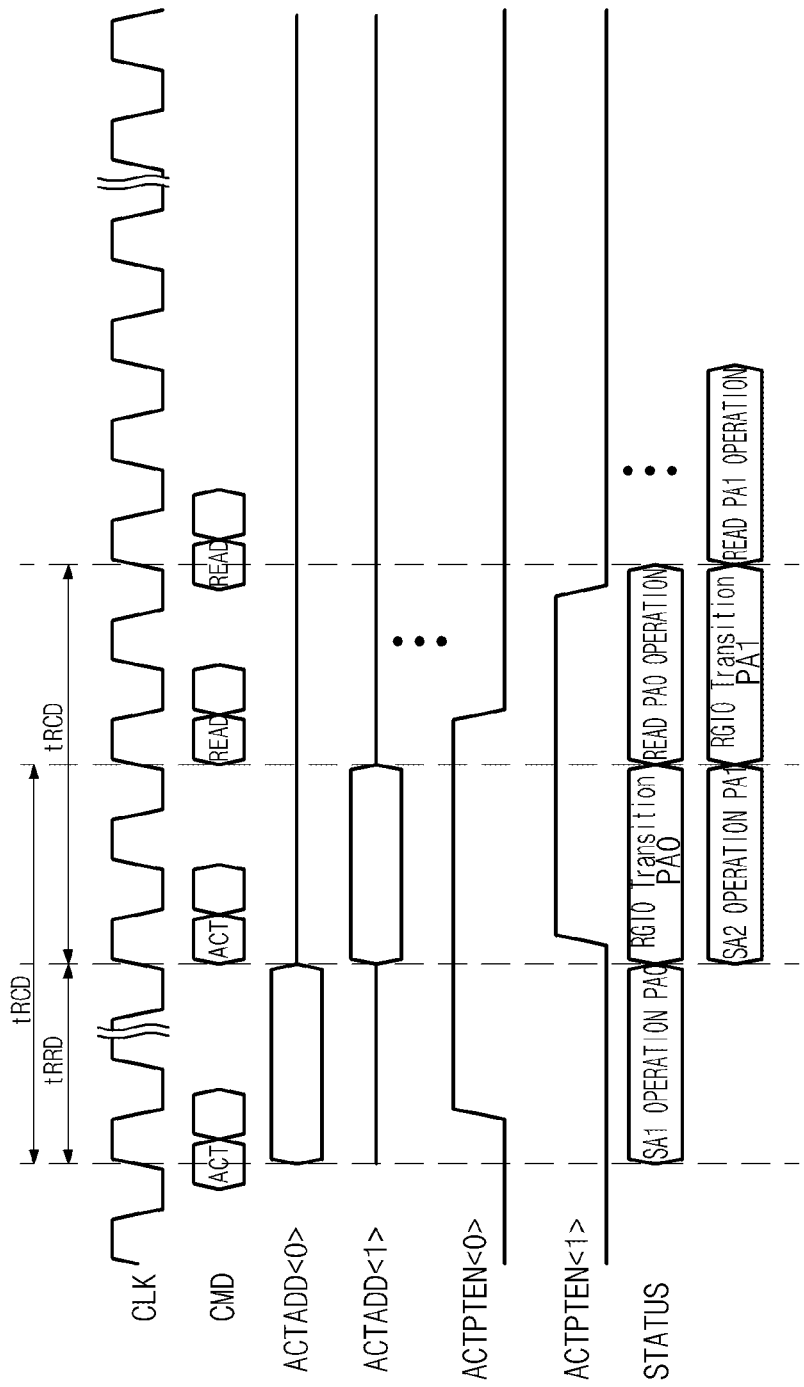
FIGS. 7 and 8 are timing diagrams illustrating a method for controlling a non-volatile semiconductor device according to an embodiment of the present invention.

FIG. 7 is a timing diagram illustrating operations of a non-volatile semiconductor device operating in an active-read operation period according to an embodiment of the present invention.

Referring to FIGS. 5 to 7, if a first active operation is performed in the first bank PA0, the sense-amplifier SA1 operates to sense and amplify data read out of the first bank PA0, and the sensed data is transferred to the transmission line RGIO.

In an embodiment, a second active operation for the second bank PA1 is performed at a specific time at which the sensing/amplification operation of the sense-amplifier SA1 is completed. During a specific period in which the data sensed by the sense-amplifier SA1 is transferred to the transmission line RGIO, a sensing operation of the sense-amplifier SA2 is carried out.

As described above and shown in FIG. 7, in accordance with an embodiment of the present invention, the non-volatile semiconductor device can enter another active operation within tRCD during the active-read operation, resulting in reduction in data output time.

In other words, if a first active command is applied to the non-volatile semiconductor device, the active signal ACT is activated. The decoder 100 decodes an active address ACTADD<0:3> and the active signal ACT, such that it outputs the active control signals ACTP<0:15>.

The active controllers 200_0~200_15 are configured to output the active enable signals ACTPTEN<0:15> for controlling active states of the banks upon receiving the active control signals ACTP<0:15> and the active reset signals ARST<0:15>.

Thus, assuming that, upon receiving the first active command, the active enable signal ACTPTEN<0> is activated to a high level, the active enable signal ACTPTEN<0> maintains the high level until a first read command READ is input.

A specific period in which the active enable signal ACTPTEN<0> maintains the high level may be represented by a Row Active to Column Active Delay time (tRCD).

If the active enable signal ACTPTEN<0> of the first bank PA0 is activated to the high level, the sensing and amplification operation of the sense-amplifier SA1 is performed. Upon completion of the sensing and amplification operation of the sense-amplifier SA1, data sensed by the sense-amplifier SA1 is transferred to the transmission line RGIO.

When the first bank PA0 is activated and the sensing and amplification operation of the sense-amplifier SA1 is completed, an active enable signal ACTPTEN<1> may be activated to a high level upon receiving a second active command for the second bank PA1. The active enable signal ACTPTEN<1> maintains the high level until a second read command READ is input.

A specific period from a point of time where the active enable signal ACTPTEN<0> is activated to the high level to a point of time where the active enable signal ACTPTEN<1> is activated to the high level may correspond to a Row Active to Row Active Delay time (tRRD).

In addition, a specific period in which the active enable signal ACTPTEN<1> maintains the high level may also be represented by a Row Active to Column Active Delay time (tRCD).

As a result, during a predetermined time in which data sensed by the sense-amplifier SA1 corresponding to the first bank PA0 is transferred to the transmission line RGIO, the sensing and amplification operation of the sense-amplifier SA2 is performed.

After that, if the active enable signal ACTPTEN<0> is deactivated (or disabled) to a low level, the data of the first bank PA0 is output to the output pad DQ, such that the read operation of the first bank PA0 is completed. During the above-mentioned period, the sense-amplifier SA2 corresponding to the second bank PA1 outputs sensed data to the transmission line RGIO.

Thereafter, if the active enable signal ACTPTEN<1> is disabled to a low level, the data of the second bank PA1 is output to the output pad DQ, such that the read operation of the second bank PA1 is completed.

Figure 8:
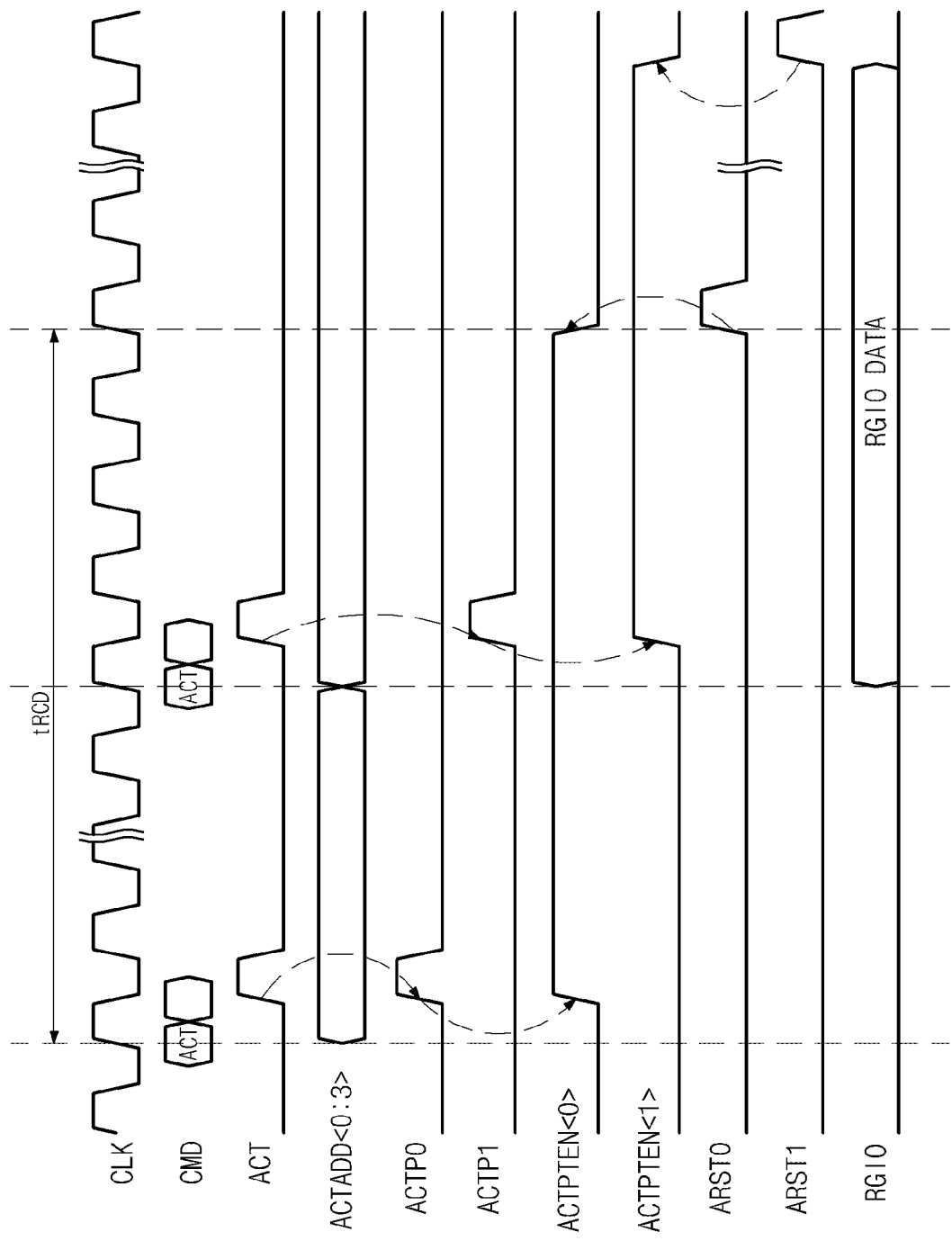

FIG. 8 is a timing diagram illustrating operations of a non-volatile semiconductor device operating in the active-read operation period according to an embodiment of the present invention.

Referring to FIG. 8, upon receiving a first active command, the active signal ACT is activated. Accordingly, the decoder 100 decodes the active address ACTADD<0:3>, such that it outputs the active control signals ACTP<0:15>.

Assuming that, upon receiving the first active command, the active control signal ACTP<0> corresponding to the first bank PA0 is activated to a high level, the active enable signal ACTPTEN<0> is activated to a high level in response to the active control signal ACTP<0>. The active enable signal ACTPTEN<0> maintains the high level until a first active reset signal ARST<0> is activated.

In this case, a specific period in which the active enable signal ACTPTEN<0> maintains the high level may be represented by a Row Active to Column Active Delay time (tRCD).

Upon receiving a second active command for the second bank PA1 while the first bank PA0 is activated, the active signal ACT is activated, and then the active control signal ACTP<1> is activated to a high level in response to the active signal ACT.

The active enable signal ACTPTEN<1> is activated to a high level in response to the active control signal ACTP<1>. The active enable signal ACTPTEN<1> maintains the high level until a second active reset signal ARST<1> is activated.

In accordance with an embodiment of the present invention, the active control signal ACTP<0> and the active control signal ACTP<1> are separated from each other, such that the active enable signal ACTPTEN<0> can be activated independently from the active enable signal ACTPTEN<1>.

As a result, the sensing operation of the second bank PA1 is performed even in a specific period in which the first bank PA0 is activated, and the sensed data of the first bank PA0 can be successively transferred to the transmission line RGIO.

As is apparent from the above description, during a predetermined time in which data of one bank is transferred to a transmission line RGIO, it is possible to perform a sensing operation of another bank, such that tRRD is reduced and the efficiency of data output can be increased.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile semiconductor device, comprising:
    a decoder configured to output a plurality of active control signals by decoding an active address and an active signal;
    a plurality of active controllers configured to generate a plurality of active enable signals in response to the plurality of active control signals and a plurality of active reset signals, the plurality of active enable signals being independently activated;
    a plurality of banks, wherein active states of the banks are selectively controlled by the plurality of active enable signals;
    a plurality of sense-amplifiers configured to sense and amplify data read out of the banks and transmit the amplified data to a transmission line; and
    a row data buffer configured to buffer the amplified data transmitted from the transmission line to compensate for a difference between a programming operation time and a read operation time of the plurality of sense-amplifiers,
    wherein a second sense-amplifier corresponding to a second bank performs a sensing operation in response to a corresponding active enable signal during a predetermined time in which a first sense-amplifier corresponding to a first bank transmits sensed data to the transmission line, and
    wherein, during a predetermined time in which the second sense-amplifier corresponding to the second bank transmits sensed data to the transmission line, a read operation for the first bank is performed.

2. The non-volatile semiconductor device according to claim 1, wherein, if the active signal is activated, the plurality of active control signals is activated independently from each other.

3. The non-volatile semiconductor device according to claim 1, wherein the plurality of active enable signals is respectively activated in response to the plurality of active control signals, and remains activated during a Row Active to Column Active Delay time (tRCD).

4. The non-volatile semiconductor device according to claim 1, wherein the plurality of active enable signals is respectively deactivated in response to the plurality of active reset signals.

5. The non-volatile semiconductor device according to claim 1, wherein a Row Active to Row Active Delay time (tRRD) is shorter than a Row Active to Column Active Delay time (tRCD).

6. A method for controlling a non-volatile semiconductor device, the method comprising:
   outputting a first active control signal and a second active control signal by decoding an active address and an active signal;
   activating a first active enable signal in response to the first active control signal so as to activate a first bank;
   activating a second active enable signal in response to the second active control signal to activate a second bank while the first bank is activated;
   operating a first sense-amplifier corresponding to the first bank;
   operating a second sense-amplifier corresponding to the second bank during a predetermined time in which the first sense-amplifier transmits sensed data to a first transmission line, wherein the second sense-amplifier transmits sensed data to a second transmission line during a read operation period in which data of the first transmission line is output; and
   buffering amplified data transmitted from the first and second transmission lines to compensate for a difference between a programming operation time and a read operation time of the first and second sense-amplifiers.

7. The method according to claim 6, wherein the first active enable signal and the second active enable signal are activated independently from each other and remain activated during a Row Active to Column Active Delay time (tRCD).

8. The method according to claim 6, wherein the first active control signal is activated at a different time than the second active control signal.

9. The method according to claim 6, further comprising:
   deactivating the first active enable signal in response to a first active reset signal; and
   deactivating the second active enable signal in response to a second active reset signal.

* * * * *